United States Patent [19]

Graham

[11] Patent Number: 4,838,664

[45] Date of Patent: Jun. 13, 1989

[54] DIAGNOSTIC OVERLAY

[76] Inventor: Brent Graham, 1734 - 196th Street, Langley, B.C., Canada, V3A 4P4

[21] Appl. No.: 71,628

[22] Filed: Jul. 9, 1987

[30] Foreign Application Priority Data

Jul. 10, 1986 [CA] Canada ................................. 513523

[51] Int. Cl.$^4$ ......................... G02F 1/13; G01R 15/12
[52] U.S. Cl. ................................ 350/351; 350/331 T; 324/73 PC; 324/73 R
[58] Field of Search ........................... 350/351, 331 T; 324/73 PC, 73 R, 158 R, 158 P, 158 F; 365/108, 120, 127; 364/557, 481

[56] References Cited

U.S. PATENT DOCUMENTS

| | | | |
|---|---|---|---|
| 3,889,053 | 6/1975 | Lloyd et al. | 350/351 |
| 4,006,414 | 2/1977 | Parker | 350/351 |
| 4,279,152 | 7/1981 | Crossland | 350/351 |
| 4,475,811 | 10/1984 | Brunner | 324/158 R |
| 4,538,105 | 8/1985 | Ausschnitt | 324/158 R |

Primary Examiner—Stanley D. Miller
Assistant Examiner—Trong Quang Phan
Attorney, Agent, or Firm—Hughes & Multer

[57] ABSTRACT

An overlay for an electronic circuit used as a diagnostic apparatus and a method of conducting the diagnosis using the overlay. A plurality of temperature sensitive areas which are made from encapsulated liquid crystal zones are positioned on the overlay in accordance with the spatial configuration of the electronic components with which the overlay is to be used. Each of the temperature sensitive areas is aligned with a respective component on the electronic circuit and each of the liquid crystal zones has a first color identical to the color of the rest of the crystals when the respective electronic components are within a predetermined temperature range. When the temperature of a component changes by a certain quantity, the color of the crystal zone also changes, which change is visually observed.

21 Claims, 5 Drawing Sheets

DIAGNOSTIC OVERLAY

INTRODUCTION

This invention relates to a diagnostic device for electronic components and, more particularly, to a diagnostic overlay for an electronic circuit board which utilizes a plurality of encapsulated liquid crystal zones being colour indicative in respect of temperature changes.

BACKGROUND OF THE INVENTION

Electronic circuits comprise a plurality of operating electronic components, typically including transistors, resistors, delays and integrated circuits ("ICs") or chips. Such ICs may include ROMS, memory chips, drivers, receivers, gates and microprocessors. ICs serve a variety of tasks and may be classed on the basis of their complexity such as being small scale integration ("SSI"), medium scale integration ("MSI"), large scale integration ("LSI") or very large scale integration ("VLSI") type ICs depending on the relative complexity of the chip. The speed at which an IC processes signals may vary between direct current (D.C.) levels and frequencies of several megahertz and higher. The various electrical parameters such as voltage and current are fixed during manufacture and are generally described as a range in the manufacturers specifications by way of a defined minimum, maximum and typical. The waveforms processed by an IC may be classified as either digital or analog. Analog waveforms may take any shape while digital signals are ideally square waves. Various factors, including the functional integrity of the electronic component, may prevent the appearance of a true square wave. Each of the integrated circuits is required to operate normally in order to maintain the operating characteristics of the electronic circuit as a whole.

When the operation of a component on the board is deficient, the operating characteristics of the board change and if the change is of a sufficient magnitude, the operating characteristics will be deficient leading to a breakdown of the desired electronic response of the circuit as a whole.

Determining the source of electronic circuit problems has been difficult. Typically, the source is a deficient component but determining which component is at fault on the board has been a laborious task. Diagnostic tools previously used are sophisticated, difficult to operate, usually non-portable and expensive. In field repair situations, an emphasis may be on avoiding downtime and a field engineer is under pressure to get the system operational without delay. There is a strong tendency, therefore, to swap out boards or subsystems on a probability basis, leaving the task of actual fault identification to the board repair facility. Upon arrival at a board repair depot, the boards are screened and the faults duplicated before any repair action is undertaken. This procedure can be time consuming, expensive, and cause fluctuations in inventory levels of spare boards which makes "just-in-time" management principles difficult to implement.

The test technique of thermal image analysis is an industry accepted method of detecting electronic components with abnormal thermal characteristics. For proven circuit designs, such defects are generally indicative of IC failure or board artwork defects while in new designs the technique can be used to locate underspecified components or poorly designed ventilation.

The prediction of the thermal activity of electronic components involves complex calculations involving numerous variables and parameters, many of which may not be easily measured or predicted themselves. While mathematical models have been constructed to describe electronic components in a laboratory environment under controlled conditions, no practical universal formula can be presented to predict the operating temperature of an IC under all circumstances. Generally, predictions regarding thermal activity must be derived from extrapolation of the data obtained by sampling good components operating under a variety of fixed conditions.

For a certain amount of D.C. power dissipated in a semiconductor, the junction temperature reaches a value determined by such factors as the thermal conductivity of the chip carrier materials and the differential temperature of the environment. As continued in the *Motorola Application Note An*-509, the junction temperature may be calculated for a steady state condition by the following formula:

$$T(j) = P(d)*R(stdy) + T(amb)$$

Where:
  $T(j)$ = junction temperature
  $P(d)$ = power dissipated at the junction
  $R(stdy)$ = steady state thermal resistance-junction to ambient
  $T(amb)$ = ambient temperature The above equation holds true only for DC power at thermal equilibrium. Under dynamic conditions, the thermal response of the system must also be taken into account and duty cycle analysis must be performed. The junction temperature at the end of a pulse train will not equal the sum of the average temperature rise values because cooling occurs between pulses. Thus, the following equation is applicable:

$$T(jav) - T(c) = R(jc)*P(d)*D$$

Where:
  $T(jav)$ = average junction temperature increase
  $T(c)$ = chip case temperature
  $R(jc)$ = thermal resistance-junction to case
  $P(d)$ = DC power
  $D$ = duty cycle To further complicate matters, the concept of duty cycle is based on the presence of a steady pulse train of identical square waves, a condition not often seen in practical electronic circuits. Most waveforms are somewhat non-rectangular having varying frequencies and periods.

Of the various damage mechanisms operating on electronic components, many have been found to be linked to power density fluctuations, either as cause or effect. By virtue of the above equations, such damage mechanisms are ultimately tied to temperature variations. Thus, when the operation of an electronic component becomes deficient by any mechanism which alters the net level of power dissipation and such deficiency is of sufficient magnitude and duration as to alter the temperature of the outer surface of the component, then the temperature change recorded on the outer surface will yield a relative measurement of the deficiency. Further, the elevated temperature may itself constitute a damage mechanism causing secondary breakdown.

SUMMARY OF THE INVENTION

According to one aspect of the invention, there is provided a method of diagnosing an electronic circuit comprising positioning an overlay in substantial contact with said circuit, aligning at least one of a plurality of temperature responsive liquid encapsulated crystal zones on said overlay with a respective one of a plurality of electronic components on said circuit and observing the color of said encapsulated crystal zones while said circuit is under operation for a predetermined time period.

According to a further aspect of the invention, there is provided an overlay operable to be positioned in substantial contact with at least one electronic component of an electronic circuit, said overlay comprising at least one encapsulated liquid crystal zone operable to be aligned with a respective component of said circuit, said liquid crystal zone being color indicative to a predetermined temperature of said component.

According to yet a further aspect of the invention, there is provided an overlay for an electronic circuit, said overlay comprising a plurality of temperature responsive micro-encapsulated liquid crystal zones positioned in respective areas of said overlay, each of said liquid crystal zones having substantially the same color at each of a plurality of operating temperatures, each of said crystal zones differing in color when each of said plurality of operating temperatures changes by a predetermined quantity.

According to yet a further aspect of the invention, there is provided a microencapsulated liquid crystal zone operable to be brought into contact with at least one electronic component, said microencapsulated liquid crystal zone being color indicative to a predetermined temperature of said component.

BRIEF DESCRIPTION OF THE SEVERAL VIEWS OF THE DRAWINGS

A specific embodiment of the invention will now be described, by way of example only, with the use of drawings in which.

DESCRIPTION OF SPECIFIC EMBODIMENT

Figure 1:
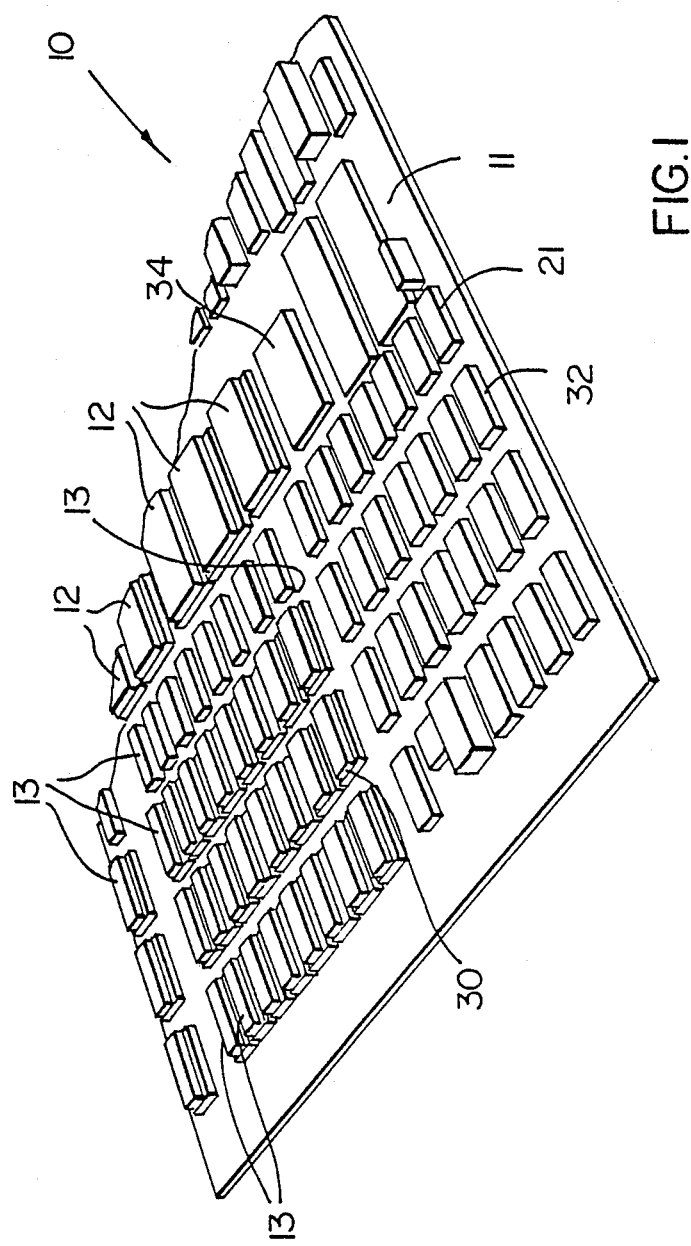
FIG. 1 is a partial isometric view of a typical printed circuit board used on an IBM PC personal computer.

Reference is initially now made to FIG. 1 where the mother printed circuit board from an IBM PC personal computer is generally illustrated at 10. It consists of the board 11 itself, and a variety of components such as integrated circuits including ROMS 12, RAM chips 13, and gates such as that gate at 21. The various components extend outwardly from the printed circuit board 11 a variety of distances depending on the design of the circuit as a whole and the various components as clearly observed in FIG. 1.

Figure 2:
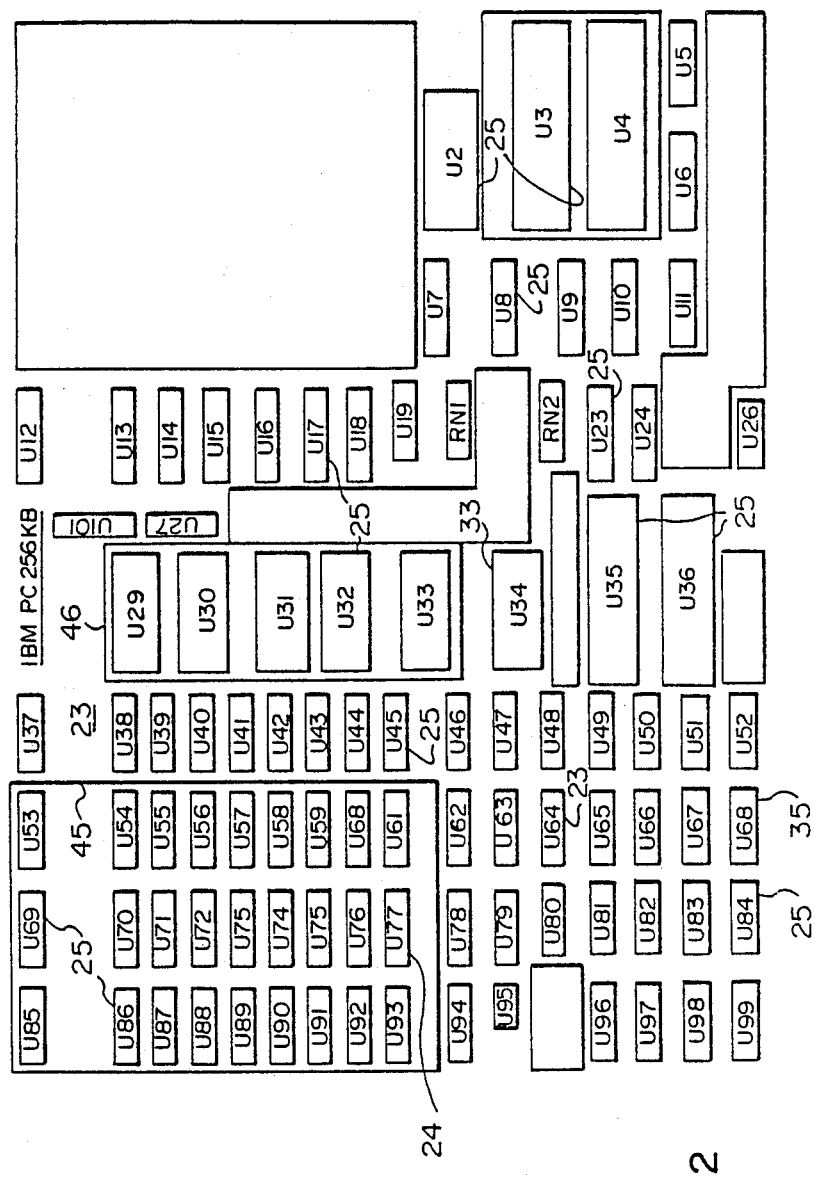
FIG. 2 is a plan view of a diagnostic overlay according to the invention used with the printed circuit board of FIG. 1.
Figure 3:
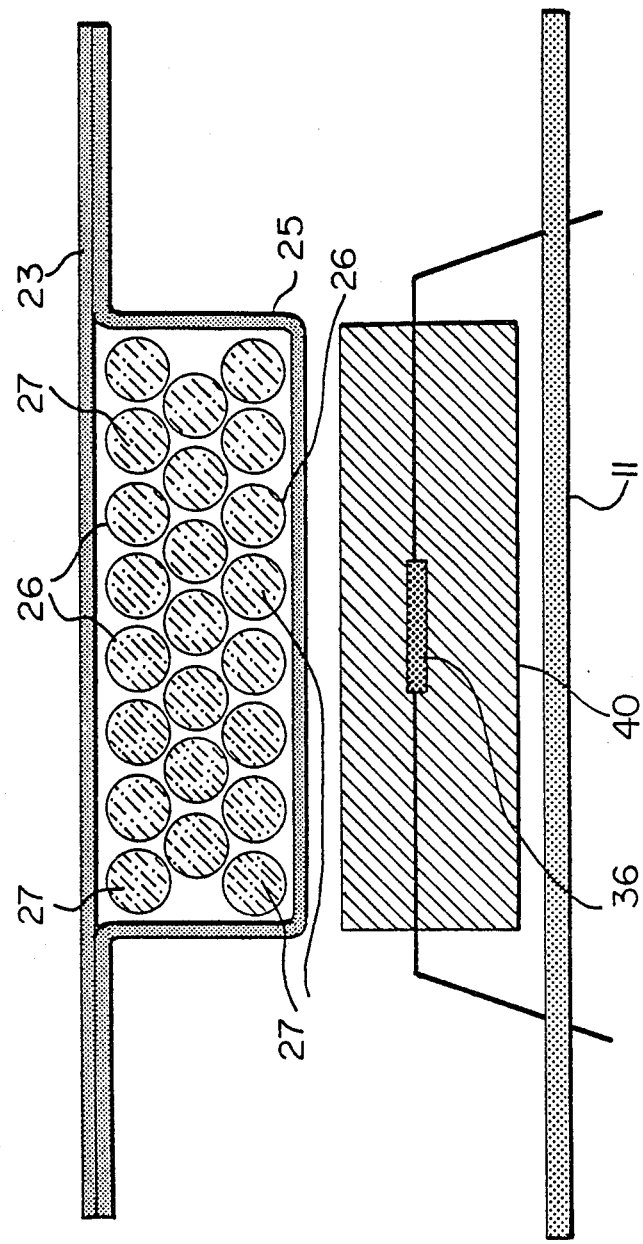
FIG. 3 is a diagrammatic cross-sectional enlarged view of a single integrated circuit on the circuit board with the overlay of FIG. 2 illustrated in its operating position.

The diagnostic overlay is shown generally at 23 in FIG. 3. The overlay 23 is made of transparent mylar and it carries a plurality of temperature sensitive zones 25 which are each made up a plurality of microcapsules 26, each capsule carrying a number of liquid crystals 27 which are color temperature sensitive. The microencapsulated liquid crystals are illustrated more clearly in FIG. 3. The micro-encapsulated liquid crystals 26 are bonded within the temperature sensitive zones 25 on the overlay 23 and each zone 25 corresponds in location to the heat source zone which is typically the central area of the corresponding integrated circuit or electronic component on the circuit board 11. For example, FIG. 2 illustrates the indexing rectangles surrounding the temperature sensitive zones for integrated circuits of five different sizes. The size of each rectangle corresponds to the size of each component with which contact is desired and the location of the rectangle is identical to the location of the component on the printed circuit board 11. For example, the temperature sensitive zone 24 corresponds to integrated circuit 30 on the board 11; the temperature sensitive zone 35 corresponds to integrated circuit 32 and the temperature sensitive zone 33 corresponds to the integrated circuit 34. The color of each temperature sensitive zone on the overlay 23 is designed to be the same under normal operation depending on the normal operating temperature of each corresponding integrated circuit on the printed circuit board 11.

FIG. 3 illustrates the printed circuit board 11 with a typical component comprising the integrated circuit 36 and the carrier 40 illustrated as extending outwardly therefrom. The overlay 23 diagrammatically illustrates the temperature sensitive zone 25 within which are positioned the microcapsules 26 carrying the liquid crystals 27. The temperature sensitive zone 25 is illustrated just prior to contact with the integrated circuit 36.

The various components which are positioned on the board 11 may extend outwardly from the board 11 various distances. To allow contact between each series of components having the same height and the overlay 23, the overlay 23 is divided into sections. Two such sections 45, 46 are illustrated in FIG. 2. These sections and others may be removed from the overlay 23 by way of perforations, etc. so that they may be positioned on the components or the circuit board 11 to which they relate, such components having the same height.

Figure 4:
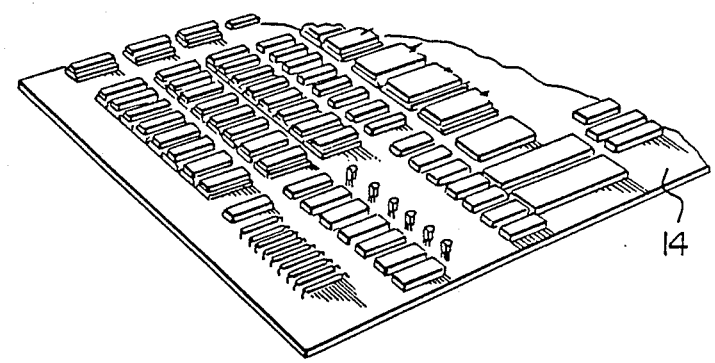
FIG. 4 is a partial isometric and diagrammatic view of a further printed circuit board similar to FIG. 1.
Figure 5:
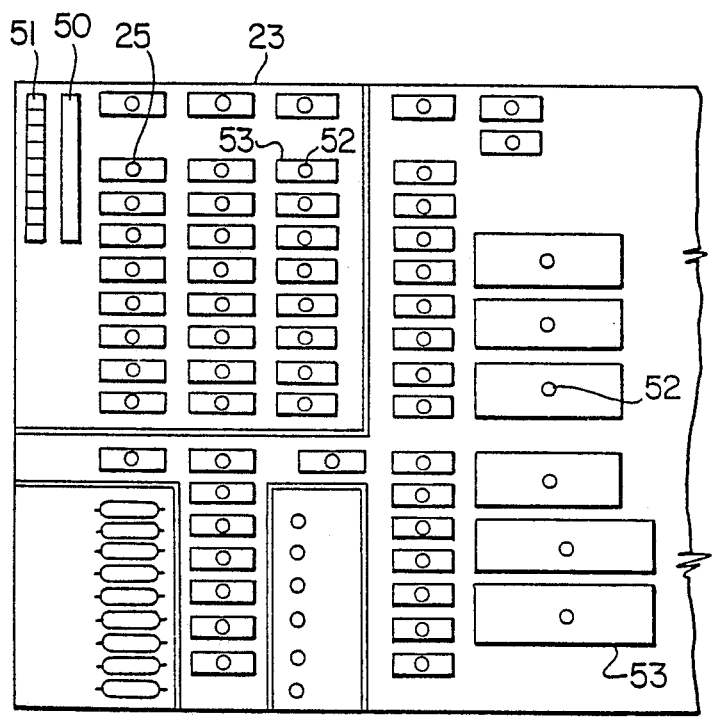
FIG. 5 is a plan view of the plurality of diagnostic overlays used with the printed circuit board of FIG. 4.

Referring now to FIG. 5, the diagnostic overlay 23 is not only divided into different sections but there is provided a further temperature responsive liquid crystal encapsulated zone 50 on the overlay 23 which is not associated with an electronic component on the printed circuit board 14 of FIG. 4. This further zone 50 may be printed on each of a plurality of overlays 23, each overlay 23 being designed for the same printed circuit board but each overlay 23 being for use at different ambient temperatures. The further zone 50, when appropriate, gives a visual indication of when the overlay 23 may be used in accordance with the particular ambient temperature. The visual indication may be, for example, a color such as green or a letter readout such as "USE-ME"

when the ambient temperature is appropriate for that particular overlay.

A color standard chart 51 may also be used on the overlay 23 as seen in FIG. 5. The color standard chart 51 is simply a comparator for comparing the color of the liquid crystal zone on top of an electronic component. This may be useful, for example, when the overlay 23 is viewed under different lighting conditions such as outdoor or natural lighting conditions and indoor or artificial lighting conditions. The chart 51 is not temperature sensitive and the colors given in the chart 51 are arranged in the same order as the colors in the liquid crystal change when the temperature of the particular electronic component changes.

OPERATION

In operation, there may be provided a plurality of overlays 23, each being identically configured for each circuit board 11. As earlier explained, each overlay 23, however, is constructed for use in a different range of ambient temperatures. For example, if the board 11 was to be operated under varying temperature conditions, then a series of overlays 23 would be constructed to be correctly color indicative under the various ranges of these conditions. To this end the further liquid crystal encapsulated zone 50 (FIG. 5) will be consulted to ensure that the particular overlay 23 is the correct one to be used under the particular ambient temperature conditions. An indicating signal such as a green color or a visual message will appear on the zone 50, the presence of such color or visual message indicating to the user that the particular overlay 23 is the correct one to be used.

Figure 6:
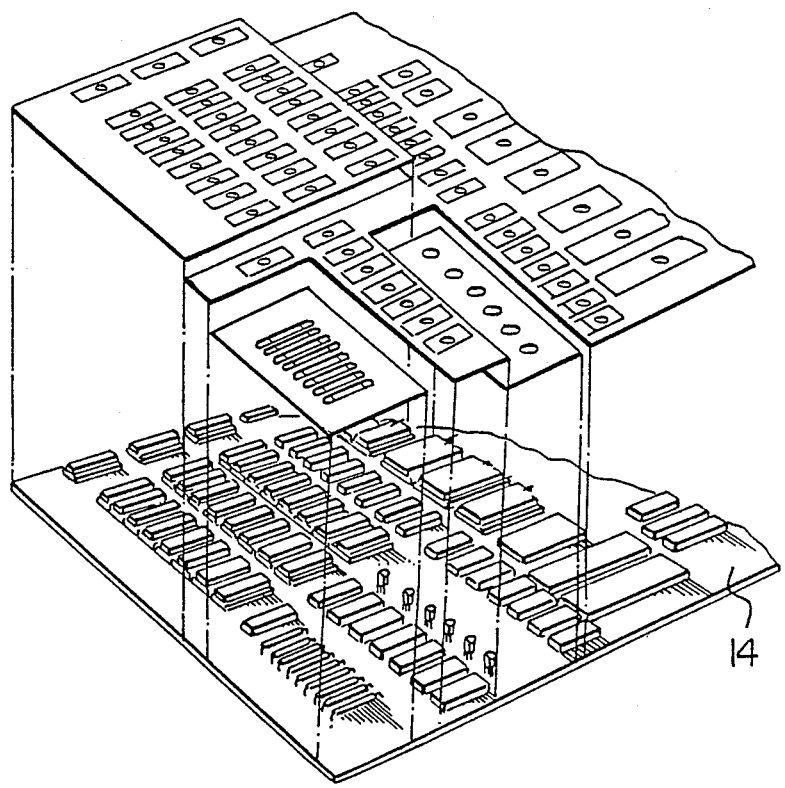
FIG. 6 is a partial isometric and diagrammatic view of the circuit board of FIG. 4 being used with the overlays of FIG. 5.

After the correct overlay 23 has been chosen, each temperature sensitive zone 25 on the overlay 23 is located opposite its corresponding integrated circuit, the indexing rectangles of FIG. 2, for example, surrounding the temperature sensitive zones being on a 1:1 relationship with its integrated circuit. The overlay 23 is then brought into contact with the circuit board 10. The 1:1 relationship between the rectangles surrounding the temperature sensitive zones and the outermost surface of each integrated circuit is for easy alignment or indexing purposes.

Where there are a series of components which have a different height on the circuit board 14 than the remaining components such as those illustrated in FIG. 4 and 6, the indexing rectangles together with their temperature sensitive zones may be removed from the overlay 23 by using perforations or by cutting as illustrated in FIG. 6. These portions are then aligned with their own respective components.

The circuit is then subject to the correct operating voltage and the color of the temperature sensitive zone is observed after a certain time period depending on the ambient temperature. For example, it is known that the proper operating temperature of the ROM chips 12 on the printed circuit board 11 is approximately between 24° C. and 26° C. with about 24° C. being optimum after one minute of operation at 20° C. ambient temperature. The corresponding liquid crystal is designed to appear green within this operating temperature range. Likewise, it is known that the operating temperature of the RAM chips 13 is between 23.5° C. and 24.5° C. under the same conditions. Again, the corresponding liquid crystal is designed to appear green when the chip is operating at the correct temperature. Thus, an observer would see a plurality of crystals all appearing green when the printed circuit board is operating correctly after the specified time lapse.

Where, however, a component is not operating correctly; that is, when there is a deficient integrated circuit, it will, in a great majority of cases, increase in temperature beyond its normal operating temperature. In this event, the temperature sensitive zone will not be seen as green but, typically, its color will range higher on the color spectrum to, say, blue or violet. Outside the visible range, the liquid crystal will appear black. If the temperature, as may be the case in certain defective operating characteristics, is lower than the correct operating temperature of the component, the color of the liquid crystal will typically be lower on the visible spectrum to, say, red or brown. Again, black may also be used at the lower range. Where the component is defective, therefore, the color of the liquid crystal is readily observed to differ from the green color showing normal operation and such a component can be quickly identified.

The components of an electronic circuit are generally highly interactive and. as such, the presence of a fault in one component will often alter the power level and, hence, the operating temperature of a second component with which it interacts. In this case, the faulty component will often become visible first, followed by a color change at the second component at a later time. As a general rule, the first found faulty element should be considered the most serious. The component will then be replaced and the circuit will be retested.

Under different lighting conditions, the colours of the encapsulated liquid crystal zones 25 may appear different. To aid in determining the correct color, the user may refer to the color standard chart 51 (FIG. 5). The color standard chart 51 is not, of course, temperature sensitive and the colours in the chart 51 are arranged in the same order as the color change in the particular liquid crystal zone 25 will proceed as the temperature changes.

A number of modifications are currently contemplated in the embodiment specifically described. For example, although the colored rectangles surrounding the temperature sensitive zones are required only for properly indexing the temperature sensitive zones with the corresponding electronic components, they are otherwise not necessary. Any number of indexing devices may be utilized for proper alignment including pins extending between the overlay and the circuit board, rectangular openings for other components and the like.

While the overlay illustrated has been described as being made from transparent mylar, such a configuration is again used for alignment purposes only together with the rectangles. Assuming indexing is performed using other techniques, the overlay could be opaque or colored as desired.

The fact that the temperature reading should be taken at a specific time after the correct operating voltage is applied to the board at a certain ambient temperature need not be limiting. For example, a temperature-time graph could be provided which would give the correct reading time for each ambient temperature. Thus, the overlay can be used over a wide range of ambient temperatures. In addition, a thermometer only may be mounted on the overlay 23 to ensure that the ambient temperature is correct when the color changes are to be observed.

While the liquid crystal zones 25 have been described as being generally the shape of the component which is being tested, the zones 25 may clearly be only a small portion such as a circle 52 of the area of the various indexing rectangles 53 as illustrated in FIG. 5.

Similarly, while the overlay 23 has been described as a device separate from the printed circuit and the electronic components which make up the printed circuit, it is contemplated that the overlay 23 may be permanently affixed to the circuit or, alternatively, that a plurality of individual liquid crystal encapsulated zones could be used, one of each of the zones being permanently affixed to a particular electronic component which would provide a built in or permanent thermal imaging system thus eliminating the need for alignment.

Many other changes may be made in the apparatus described and the specific embodiment set out herein should be taken as illustrative only and not as limiting the scope of the invention as defined in accordance with the accompanying claims.

What is claimed is:

1. A method of diagnosing an electronic circuit comprising positioning an overlay substantially in contact with said electronic circuit, aligning at least one of a plurality of temperature responsive liquid encapsulated crystal zones on said overlay with at least a respective one of a plurality of electronic components on said electronic circuit and observing the color of said liquid encapsulated crystal zones while said electronic circuit is under operation for a predetermined time period.

2. The method of claim 1 wherein said overlay is transparent.

3. The method of claim 2 wherein said overlay is mylar.

4. The method of claim 3 and further comprising indexing the position of said mylar overlay relative to said circuit board.

5. The method of claim 1 wherein there is a plurality of said overlays, said method further comprising selecting an appropriate one from said plurality of overlays operable to be used with the same electronic circuit by referring to a further temperature responsive liquid encapsulated zone on said selected overlay, said further zone being on each of said overlays.

6. The method of claim 5 and further comprising comparing said color of said zone being observed with a series of color standards appearing on said overlay.

7. The method of claim 1 and further comprising comparing said color of said zone being observed with a series of color standards appearing on said overlay.

8. The method of claim 7 and further comprising selecting the appropriate one of a plurality of overlays operable to be used with the same electronic circuit by referring to a further temperature responsive liquid crystal encapsulated zone, said further zone being on each of said plurality of overlays.

9. An overlay operable to be positioned in substantial contact with a plurality of electronic components of an electronic circuit, said overlay comprising a plurality of encapsulated liquid crystal zones operable to be aligned with respective electronic component of said electronic circuit, said liquid crystal zones being visually color indicative to predetermined temperatures of said respective electronic components.

10. An overlay as in claim 9 wherein each of said encapsulated liquid crystal zones are substantially the same color at a predetermined time when each of said crystal zones is at a first predetermined temperature.

11. An overlay as in claim 10 wherein each of said encapsulated liquid crystal zones has a visually observable color change when said first predetermined temperature changes by a predetermined value.

12. An overlay as in claim 11 and further comprising alignment indexing means on said overlay.

13. An overlay as in claim 12 wherein said overlay is transparent.

14. An overlay as in claim 13 wherein said overlay is mylar.

15. An overlay as in claim 9 wherein said overlay is affixed to said electronic component.

16. An overlay as in claim 9 and comprising a further temperature responsive liquid encapsulated crystal zone, said further zone being color responsive to ambient temperature changes 17. An overlay as in claim 16 and further comprising a series of color standards on said overlay.

18. An overlay as in claim 9 and further comprising a series of color standards on said overlay.

19. An overlay for an electronic circuit, said overlay comprising a plurality of temperature responsive microencapsulated liquid crystal zones positioned in respective areas of said overlay, each of said liquid crystal zones having substantially the same color at each of a plurality of operating temperatures, each of said crystal zones differing in color when each of said plurality of operating temperatures changes by a predetermined quantity.

20. An overlay as in claim 19 and comprising a further temperature responsive liquid crystal zone, and further zone being color responsive to ambient temperature changes.

21. An overlay as in claim 20 and further comprising a series of color standards on said overlay.

* * * * *